(12) United States Patent
Teh

(10) Patent No.: US 10,079,211 B1
(45) Date of Patent: Sep. 18, 2018

(54) MODULAR INTERCONNECTION REPAIR OF MULTI-DIE PACKAGE

(71) Applicant: Intel Corporation, Santa Clara, CA (US)

(72) Inventor: Chee Hak Teh, Bayan Lepas (MY)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 15/719,303

(22) Filed: Sep. 28, 2017

(51) Int. Cl.
*H01L 23/52* (2006.01)
*H01L 23/538* (2006.01)
*H01L 25/065* (2006.01)
*H01L 25/18* (2006.01)

(52) U.S. Cl.
CPC ...... *H01L 23/5382* (2013.01); *H01L 23/5381* (2013.01); *H01L 25/0655* (2013.01); *H01L 25/0657* (2013.01); *H01L 25/18* (2013.01); *H01L 2225/06513* (2013.01); *H01L 2225/06517* (2013.01); *H01L 2225/06527* (2013.01); *H01L 2225/06558* (2013.01)

(58) Field of Classification Search
CPC ............. H01L 25/0652; H01L 25/0655; H01L 25/0657; H01L 23/5381; H01L 23/5382; H01L 25/18

USPC .......................................................... 257/776
See application file for complete search history.

(56) References Cited

U.S. PATENT DOCUMENTS

| | | | | |
|---|---|---|---|---|
| 7,562,271 B2 * | 7/2009 | Shaeffer | ................. | G11C 5/025 711/115 |
| 8,601,198 B2 * | 12/2013 | Teh | ....................... | G06F 13/385 710/313 |
| 9,570,132 B2 * | 2/2017 | Kim | ..................... | H01L 25/0657 |
| 9,870,337 B2 * | 1/2018 | Huffman | ............. | G06F 13/4291 |

* cited by examiner

*Primary Examiner* — Luan C Thai
(74) *Attorney, Agent, or Firm* — Fletcher Yoder, P.C.

(57) ABSTRACT

An integrated circuit device or devices is presented that include internal connection ports to transmit data to or receive data from a first portion of the integrated circuit device. The integrated circuit device(s) also include external connection ports to transmit data to or receive data from outside the integrated circuit device, such as between integrated circuit devices. The integrated circuit device also includes remapping circuitry that remaps from a first connection between a first internal connection port of the internal connection ports and a first external connection port of the external connection ports to a second connection between a second internal connection port of the internal connection ports and a second external connection port of the external connection ports.

20 Claims, 12 Drawing Sheets

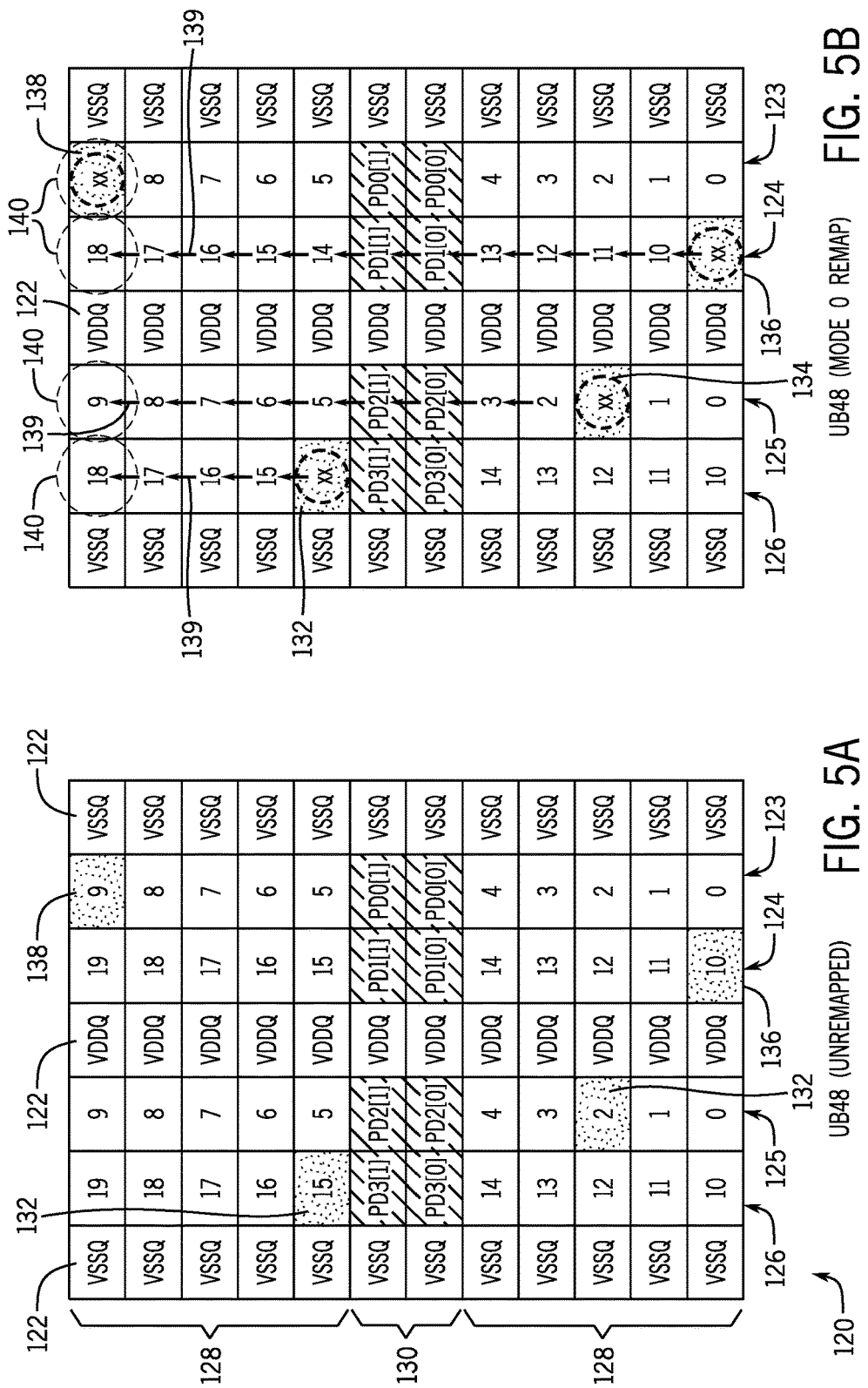
FIG. 5A  UB48 (UNREMAPPED)
FIG. 5B  UB48 (MODE 0 REMAP)

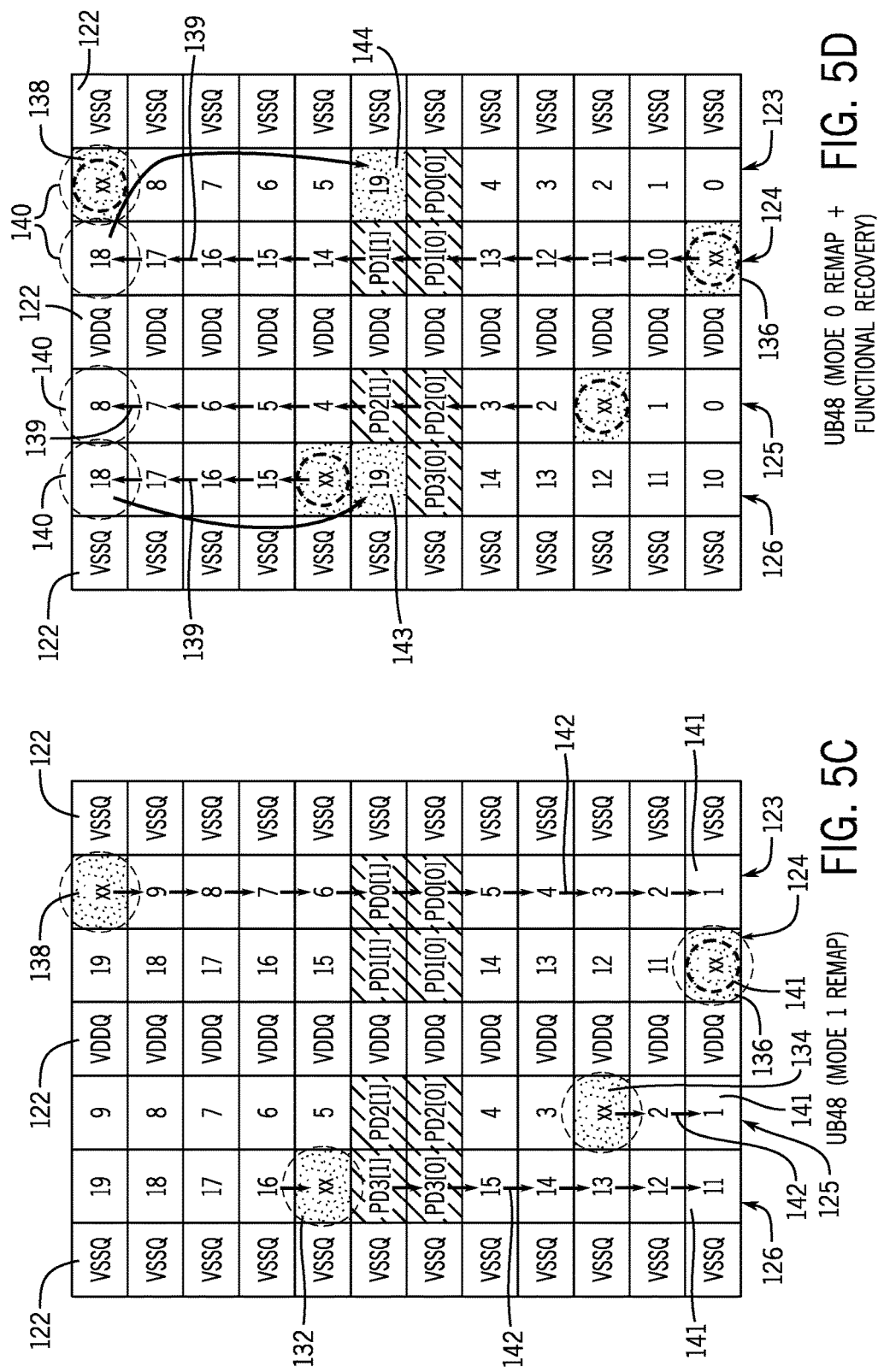

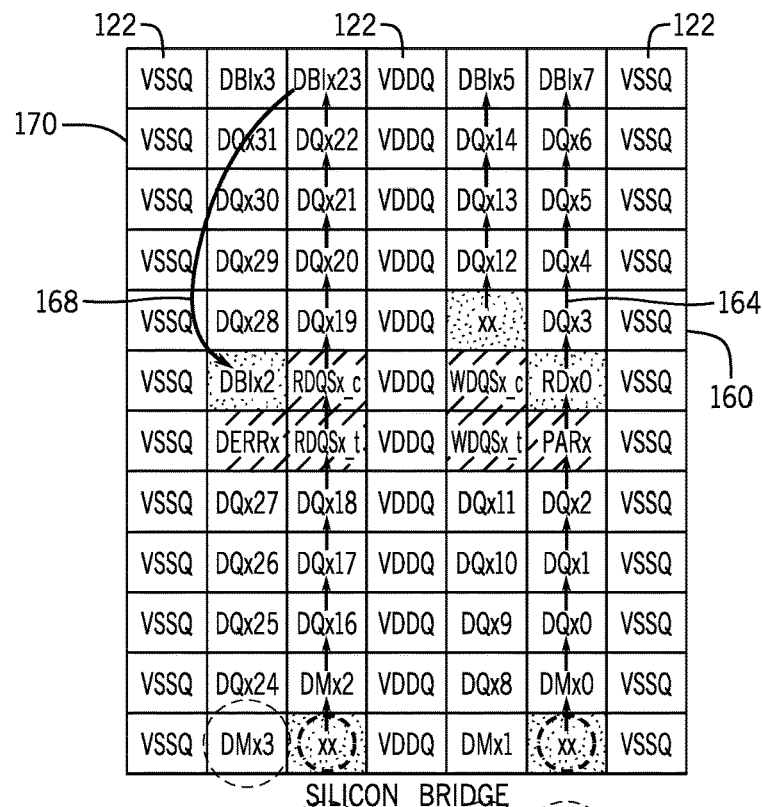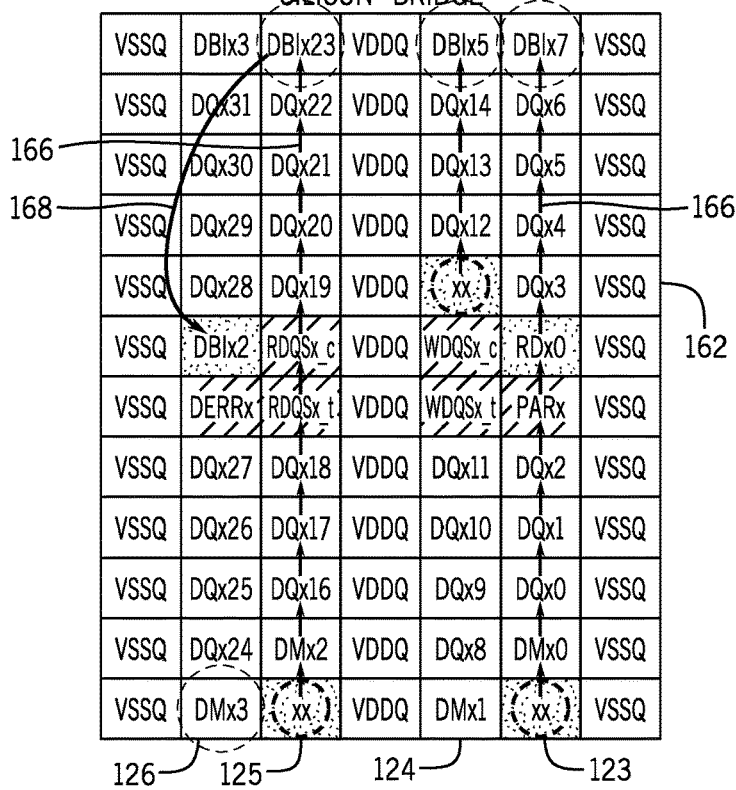
FIG. 7B

| VSSQ | L0_0 | L1_0 | VDDQ | L2_0 | L3_9 | VSSQ |
|---|---|---|---|---|---|---|
| VSSQ | L0_1 | L1_1 | VDDQ | L2_1 | L3_8 | VSSQ |
| VSSQ | L0_2 | L1_2 | VDDQ | L2_2 | L3_7 | VSSQ |
| VSSQ | L0_3 | L1_3 | VDDQ | L2_3 | L3_6 | VSSQ |
| VSSQ | L0_4 | L1_4 | VDDQ | L2_4 | L3_5 | VSSQ |
| VSSQ | PD0[0] | PD1[0] | VDDQ | PD2[0] | PD3[0] | VSSQ |
| VSSQ | PD0[1] | PD1[1] | VDDQ | PD2[1] | PD3[1] | VSSQ |
| VSSQ | L0_5 | L1_5 | VDDQ | L2_5 | L3_5 | VSSQ |
| VSSQ | L0_6 | L1_6 | VDDQ | L2_6 | L3_6 | VSSQ |
| VSSQ | L0_7 | L1_7 | VDDQ | L2_7 | L3_7 | VSSQ |
| VSSQ | L0_8 | L1_8 | VDDQ | L2_8 | L3_8 | VSSQ |
| VSSQ | L0_9 | L1_9 | VDDQ | L2_9 | L3_9 | VSSQ |

SILICON BRIDGE

| VSSQ | L3_9 | L2_9 | VDDQ | L1_9 | L0_9 | VSSQ |
|---|---|---|---|---|---|---|
| VSSQ | L3_8 | L2_8 | VDDQ | L1_8 | L0_8 | VSSQ |
| VSSQ | L3_7 | L2_7 | VDDQ | L1_7 | L0_7 | VSSQ |
| VSSQ | L3_6 | L2_6 | VDDQ | L1_6 | L0_6 | VSSQ |
| VSSQ | L3_5 | L2_5 | VDDQ | L1_5 | L0_5 | VSSQ |
| VSSQ | PD3[1] | PD2[1] | VDDQ | PD1[1] | PD0[1] | VSSQ |
| VSSQ | PD3[0] | PD2[0] | VDDQ | PD1[0] | PD0[0] | VSSQ |
| VSSQ | L3_4 | L2_4 | VDDQ | L1_4 | L0_4 | VSSQ |
| VSSQ | L3_3 | L2_3 | VDDQ | L1_3 | L0_3 | VSSQ |
| VSSQ | L3_2 | L2_2 | VDDQ | L1_2 | L0_2 | VSSQ |
| VSSQ | L3_1 | L2_1 | VDDQ | L1_1 | L0_1 | VSSQ |
| VSSQ | L3_0 | L2_0 | VDDQ | L1_0 | L0_0 | VSSQ |

MODULAR INTERCONNECTION REPAIR OF MULTI-DIE PACKAGE

BACKGROUND

The present disclosure relates generally to integrated circuit devices with interconnects between one or more die of a package. More particularly, the present disclosure relates to interconnect repair of interconnects connecting the die in the package.

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

Integrated circuits (ICs) take a variety of forms. These integrated circuits are usually formed on a silicon die. A die is a small block of semiconductor material (e.g., silicon) upon which a circuit is located. In some cases, an integrated circuit may be formed on more than one silicon die. When more than one die is used, these may be collectively referred to as die, dies, or dice. Examples of circuits that may be formed on one or more die include analog circuits, such as operational amplifier circuits, as well as digital circuits, such as digital circuitry used by processors or programmable logic devices, such as field programmable gate arrays (FPGAs). One or more die may be packaged together in an integrated circuit package. The packaging for the integrated circuit provides protection for the one or more die and their circuitry. The packaging may also provide an accessible connection to the one or more die from outside the package and/or provide interconnection between the die. However, during assembly of the package or at other times, these connections to the die and/or interconnections between the die may be incomplete.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

Present embodiments relate to systems, methods, and devices for repairing connections to a mother and/or daughter die (e.g., in an integrated circuit (IC) device package). As discussed below, one or more die interconnections to and/or from a die may be incomplete and/or flawed. Thus, the interconnections may be repaired using remapping to remap connections from outside the die to internal connections. A missing and/or incomplete interconnection into the die on a first point may be remapped to a second point into/out of the die to provide functionality at the second point. An initial functionality on the second point may also be remapped to a third point. Each functionality in a row and/or lane may be also remapped until a redundant point is reached, an end of the row and/or lane is reached, and/or a function is remapped to another unit type (e.g., from single-ended IOs to differential IOs configured for single-ended IO operation).

Various refinements of the features noted above may be made in relation to various aspects of the present disclosure. Further features may also be incorporated in these various aspects as well. These refinements and additional features may be made individually or in any combination. For instance, various features discussed below in relation to one or more of the illustrated embodiments may be incorporated into any of the above-described aspects of the present invention alone or in any combination. The brief summary presented above is intended only to familiarize the reader with certain aspects and contexts of embodiments of the present disclosure without limitation to the claimed subject matter.

BRIEF DESCRIPTION OF THE DRAWINGS

Various aspects of this disclosure may be better understood upon reading the following detailed description and upon referencing the drawings in which:

FIG. 5A illustrates a device with an unremapped format, in accordance with an embodiment;

FIG. 5B illustrates a device with a remapped format remapped in a first direction, in accordance with an embodiment;

FIG. 5C illustrates a device with a remapped format remapped in a second direction, in accordance with an embodiment;

FIG. 5D illustrates a device with a remapped format remapped in the first direction of FIG. 5B utilizing functional recovery, in accordance with an embodiment;

FIG. 7B illustrates a remapped interconnection format between the first device and the second device of FIG. 7A, in accordance with an embodiment;

FIG. 8A illustrates an unremapped interconnection format between a first device and a second device, in accordance with an embodiment;

DETAILED DESCRIPTION OF SPECIFIC EMBODIMENTS

One or more specific embodiments will be described below. In an effort to provide a concise description of these embodiments, not all features of an actual implementation are described in the specification. It should be appreciated that in the development of any such actual implementation, as in any engineering or design of projects/products, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

As discussed below, one or more die interconnections to and/or from a die may be incomplete and/or flawed. Thus, the interconnections may be repaired using remapping to remap connections from outside the die to internal connections. A missing and/or incomplete interconnection into the die on a first point may be remapped to a second point into/out of the die to provide functionality at the second point. An initial functionality on the second point may also be remapped to a third point. Each functionality in a row and/or lane may be also remapped until a redundant point is reached, an end of the row and/or lane is reached, and/or a function is remapped to another unit type (e.g., from single-ended IOs to differential IOs configured for single-ended IO operation).

Figure 1:
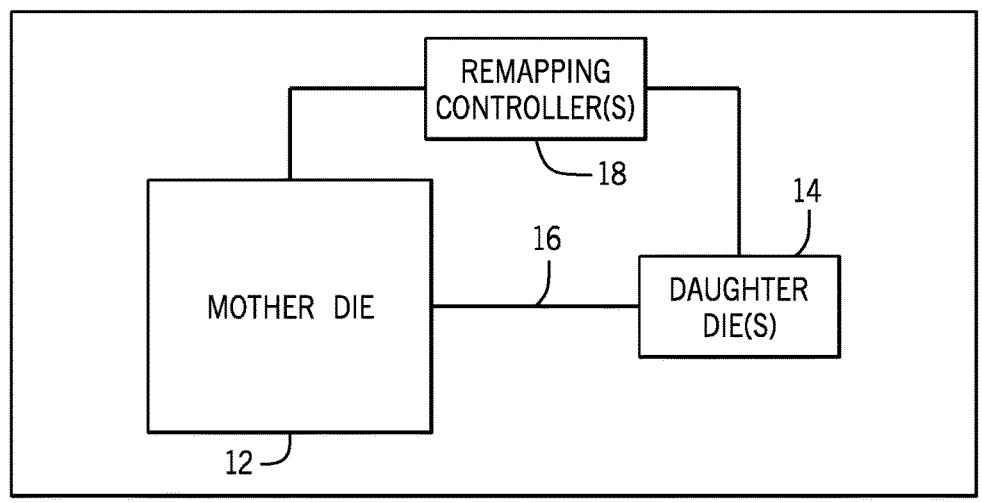
FIG. 1 is a block diagram of an integrated circuit device having multiple die therein, in accordance with an embodiment.

FIG. 1 illustrates an embodiment of an integrated circuit device 10 that includes a mother die 12 and one or more daughter die 14 that are packaged together in the integrated circuit device 10 that are connected via interconnection(s) 16. The mother die 12 may be any circuitry disposable on semiconductor substrates. For example, the mother die 12 may include processing circuitry, such as those found in a central processing unit (CPU) or programmable circuitry. In another example, the mother die 12 may include programmable logic circuitry of a programmable logic device, such as a field programmable gate array (FPGA). Additionally or alternatively, the mother die 12 may include any circuitry that interacts with other circuitry in the one or more daughter die 14. Similarly, the daughter die 14 may include any circuitry (e.g., CPU, FPGA, memory, transceiver, etc.) that interacts with circuitry of the mother die 12. The integrated circuit device 10 is then packaged together to protect the circuitry from outside elements or to distribute heat generated by the circuitry of the die 12 and 14. The packaging also facilitates connection to the mother die 12 and the one or more daughter die 14. The integrated circuit device 10 may also include remapping controller(s) 18 that are used to remap connections within the mother die 12, the daughter die 14, and/or the interconnections 16. In some embodiments, the remapping controller(s) 18 may be included in the packaging, may be included in the mother die 12 and/or the daughter die 12. In some embodiments, the remapping controller(s) 18 may be external to the packaging of the integrated circuit device 10. The packaging may be used in any variety of computing situations, such as computing acceleration in data centers.

Figure 2:
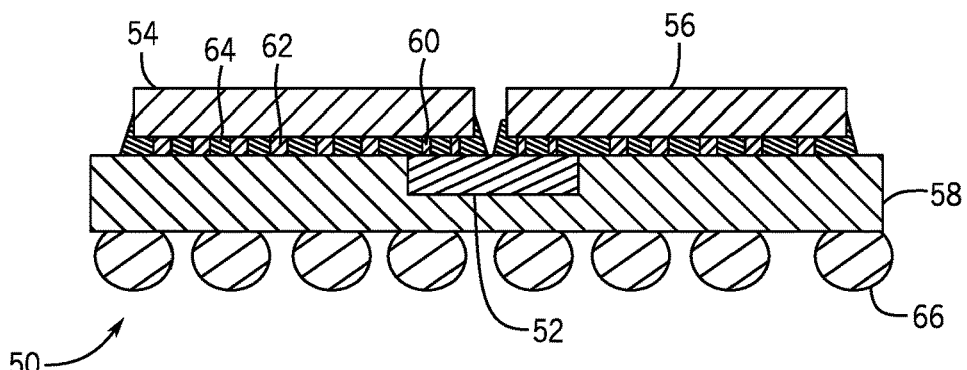
FIG. 2 is a block diagram of an integrated circuit device package with side-by-side (2.5D) arrangement of die, in accordance with an embodiment.

FIG. 2 illustrates an integrated circuit (IC) device package 50 that includes an embedded interconnect bridge 52 that connects a mother die 54 and a daughter die 56. The embedded interconnect bridge 52 is embedded in a substrate 58 of the IC device package 50. The die 54 and 56 couple to each other through the interconnect bridge 52 through micro bumps 60. The interconnect bridge 52 enables a high-density connection between the mother die 54 and the daughter die 56 with a lower manufacturing cost or complexity than using a TSV. However, the path through the interconnect bridge 52 is relatively long, thereby complicating interfacing timing closure between the mother die 54 and the daughter die 56.

Formation of the IC device package 50 includes separately coupling the mother die 54 and the daughter die 56 to the embedded interconnect bridge 52 in the substrate 58. Each separate coupling of the mother die 54 or the daughter die 56 includes a potential risk that the respective die may not attach properly with one or more faulty connections to the die.

The IC device package 50 includes die bumps 62 that couples the respective die 54 and 56 to the substrate 58. The die 54 and 56 are then underfilled using an underfill 64. The underfill 64 may be an electrically insulating adhesive. The underfill 64 increases mechanical strength of the connection between the substrate 58 and the die 54 and 56. The underfill 64 reduces thermal expansion mismatch between the die 54 and 56 and the substrate 58. The underfill 64 may be dispensed at an edge of the connection and then flowed under the device using capillary action to flow the underfill 64 between the die bumps 62. In the IC device package 50, the underfill 64 is flowed under both the mother die 54 and the daughter die 56.

The IC device package 50 includes solder balls 66 that are arranged in a two-dimensional plane to provide interconnection locations for the IC device package 50 to external devices. Each solder ball 66 provides a location to which external connections may be made for input to or output from the circuitry in the IC device package 50.

The integrated circuit device package 50 uses an interconnection path (e.g., through the silicon interconnection bridge 52) between the mother die 54 and the daughter die 56. However, the interconnects between the mother die 54 and the daughter die 56 may be faulty through misaligned microbumps, wire failure, and/or other causes.

Figure 3:
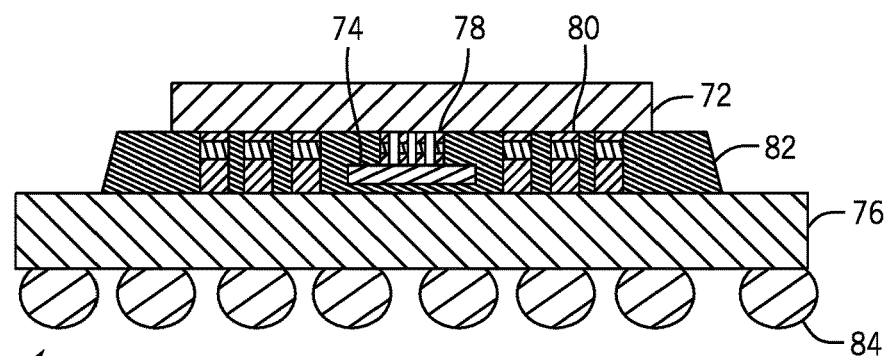
FIG. 3 is a block diagram of an integrated circuit device package with a face-to-face arrangement of die, in accordance with an embodiment.

In some embodiments, other arrangements, such as face-to-face or 3D arrangements of the mother die 54 and the daughter die 56 may be used. For example, FIG. 3 illustrates an integrated circuit (IC) device package 70 that includes a mother die 72 and a daughter die 74 oriented in a face-to-face orientation above a substrate 76 of the integrated circuit device package 70. In some embodiments, the mother die 72 and the daughter die 74 may be oriented in other configurations, such as adjacent to each other with a silicon bridge located therebetween. Additionally or alternatively, the mother die 72 and the daughter die 74 may communicate using one or more through-silicon-vias (TSVs). For example, in some embodiments, the one or more daughter die 74 may be embedded in the substrate 76. Regardless of orientation of each die, each interconnection between the die includes a potential risk that respective die may not be properly attached together.

Returning to FIG. 3, in the illustrated embodiments, faces of the mother die 72 and the daughter die 74 connect through a direct connection through micro bumps 78. Face-to-face stacking of the mother die 72 and the daughter die 74 enables a direct and short interface distance between the mother die 72 and the daughter die 74. However, in the example of FIG. 3, all connections to the daughter die 74 go through the mother die 72 via die bumps 80, though it may be appreciated that the daughter die 74 may connect to some other die in other examples. The integrated circuit device package 70 includes underfill 82, which may be an electrically insulating adhesive. The underfill 82 increases mechanical strength of the connection between the substrate 76 and the die 72 and 74. The underfill 82 reduces thermal expansion mismatch between the die 72 and 74 and the substrate 76. The underfill 82 may be dispensed at an edge of the connection and then flowed under the device using capillary action to flow the underfill 82 between the die bumps 80. In the integrated circuit device package 70, the underfill 82 is flowed under both the mother die 72 and the daughter die 74.

The integrated circuit device package 70 also includes solder balls 84 that are arranged in a pattern (e.g., grid in a two-dimensional plane) to provide interconnection locations for the integrated circuit device package 70 to external devices. Each solder ball 84 provides a location to which external connections may be made for input to or output from the circuitry in the integrated circuit device package 70.

To address interconnect failures, redundancy may be used to remap interconnects. For example, an Interconnect Redundancy Remap (IRR) may be used to improve assembly yield and/or recover functionality of a High Bandwidth Memory (HBM) stack of devices. In the second generation of the High Bandwidth Memory (HBM) standard, referred to as HBM2, defective interconnects on address words (AWORD pairs) are shifted to a next interconnect as a chain until a redundant interconnect is used. Defective interconnects on data words (DWORDS) are longer and eventually sacrifice a pin (and related functionality) and/or shifts until a longer redundant interconnect is used. Moreover, Universal Interface Bus (UIB) devices may be architected to support HBM2 interfacing by generalizing IRR support to allow repeatable Input-Output (IO) modules. For example, the IO module may be a universal bus 48 (UB48) that is a collection of 48 IOs as a basic building block of UIB. To interface with an HBM2 device, a UB48 module can be mapped as either an AWORD pair or DWORD. UIB interfacing to other dies types may have different mapping types (other than AWORD pair/DWORD). Furthermore, these other mapping types may have or may not have dedicated redundant interconnects that provide locations (e.g., pins) to shift into. However, locating the redundacies between die may be difficult due to arrangements of the die relative to each other. For example, in some embodiments, UIB-to-UIB or UIB-to-HBM2 host integration for application-specific integrated circuit (ASIC)/application-specific standard product (ASSP) may mean one UIB shifts in one direction for IRR while the other UIB/HBM2 host shifts in the reverse direction for IRR. Moreover, in some embodiments, an interconnect lost due to interconnect shifting may be recovered via other available unmapped interconnect types.

Figure 4:
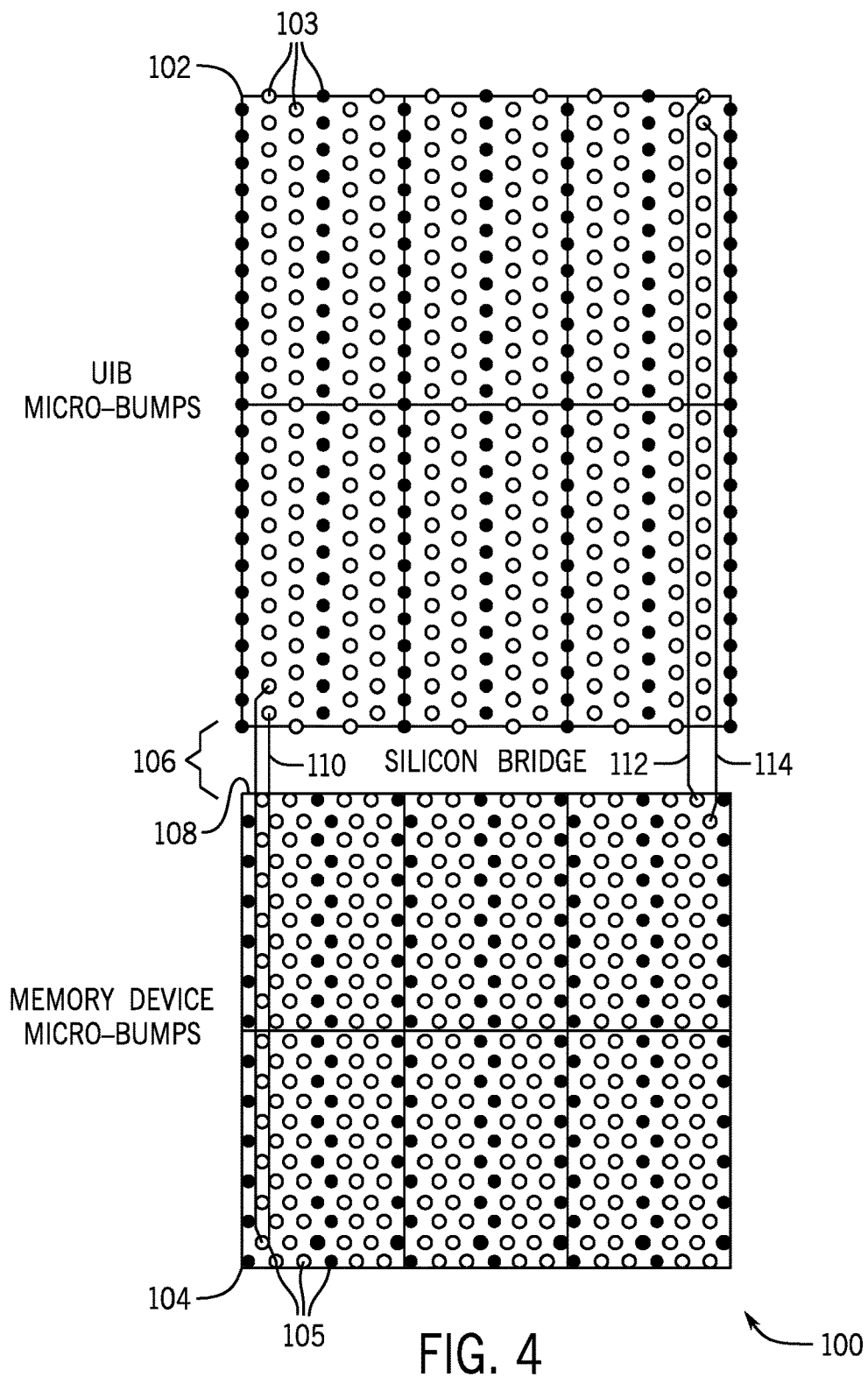
FIG. 4 illustrates a block diagram of an interconnect between a first device with multiple microbumps and another device with multiple microbumps, in accordance with an embodiment.

UIB devices interfacing to HBM2 devices (or other die) may also utilize equidistant routing on a silicon bridge/interposer to reduce skew within each UB48 module since some embodiments include no bit de-skew capabilities due to a large number of IO interconnects. This limits the interface to point-to-point interconnects that essentially mirror the interconnect shift patterns for UIB-to-UIB integration. FIG. 4 illustrates a block diagram of an interconnect 100 between a UIB device 102 with multiple microbumps 103 and an HBM2 device 104 with multiple microbumps 105. The UIB device 102 and the HBM2 device 104 are connected through an interconnection medium 106 (e.g., silicon bridge or other interposer). Routes 108 and 110 have substantially similar lengths to reduce skew. Similarly, routes 112 and 114 have substantially similar lengths to reduce skew between the signals using the related interconnects.

As discussed below, a modular interconnect repair architecture provides an interconnect repair that is protocol/mapping agnostic in that it is capable of supporting HBM2 IRR (both AWORD pairs as well as at least one DWORD type), UIB-to-UIB, and UIB-to-HBM2 host integration. The programmable interconnect repair architecture discussed herein can also recover lost interconnects due to interconnect shifting that can be mapped to recovery locations. Moreover, the programmable interconnect repair architecture may have the ability for programmable directional shift to shift functionalities in either a forward direction and/or a reverse direction.

To enable such shifts, the interconnect repair architecture may be generalized into simple logical shifts. When the two devices (e.g., die) are face-to-face, outgoing signals either shift forward/upward or reverse/downward while incoming signals shift in the reverse order. This shift may be a logical shift that can be done in any logical pipeline. The shifting direction and distance may be based on an index of a lowest unit involved in the shift (BASE) and an index of a highest unit involved in the shift (LIMIT) for each lane. The BASE and LIMIT may be any value of interconnects as long as BASE<LIMIT. A first mode (MODE 0) may be used to shift from BASE to LIMIT, and another mode (MODE 1) may be used to shift from LIMIT to BASE. Furthermore, functional recovery can be enabled to map either the first (in a forward shift) or the last (in a reverse shift) interconnect to any programmable single-ended IO (PSIO) in a programmable differential IO (PDIO) of a lane pair (selected by a FCSEL pin). In other words, a PSIO may be remapped to half of a PDIO configured for single-ended IO operation. A pin (FCID) may point to the PDIO to which the recovered interconnect is to be mapped. Another pin (FCEN) may be used to enable functional recovery of shifting PSIO functionality to PDIO units.

FIGS. 5A-5D provide examples of the mapping systems and methods previously discussed. FIG. 5A illustrates a UB48 120 with an unremapped format. The UB48 120 includes power rails 122. The UB48 120 includes lanes 123, 124, 125, and 126 that include IO units. The IO units include PSIOs 128 and PDIOs 130. The UB48 also includes faulty interconnects 132, 134, 136, and 138. FIG. 5B illustrates the UB48 120 remapped into a Mode 0 remap. Since no redundant IOs are located before an end of each lane, each remap shift 139 extends from the respective faulty IO as the BASE to an end 140 of the lane as the LIMIT. Since the illustrated shifts are in an appropriate flagged mode (e.g., Mode 0), each of the shifts are in the forward/upward direction.

FIG. 5C illustrates a reverse shift corresponding to a corresponding mode (e.g., MODE 1). Since no redundant IOs are located in each lane, each remap extends from the respective faulty IO as the BASE to an end 141 of the lane as the LIMIT as a shift 142. Since no redundant IOs are located in each lane before the end 141 of the respective lane, each remap extends from the faulty IO as the LIMIT to a respective end 141 of the lane as the BASE. Since the shift is in an appropriately flagged mode (e.g., Mode 1), each of the shifts 142 are in the reverse/downward direction. FIG. 5D illustrates a forward shift with a functional recovery enabled. In lanes 124 and 126, are shifted to PDIO 143 and 144, respectively to maintain the functionality of the functions of the interconnects being remapped. In other words, FIG. 5D represented a similar remapping to that shown in FIG. 5B with functionalities being shifted to PDIO due functionalities to be shifted that are not able to be remapped before an end of the respective lanes. The original functions at these locations are then shifted to a corresponding location outside of the typical lane. For example, the corresponding location may be a PDIO in the lane and/or a PDIO on a different lane.

Figure 6A:
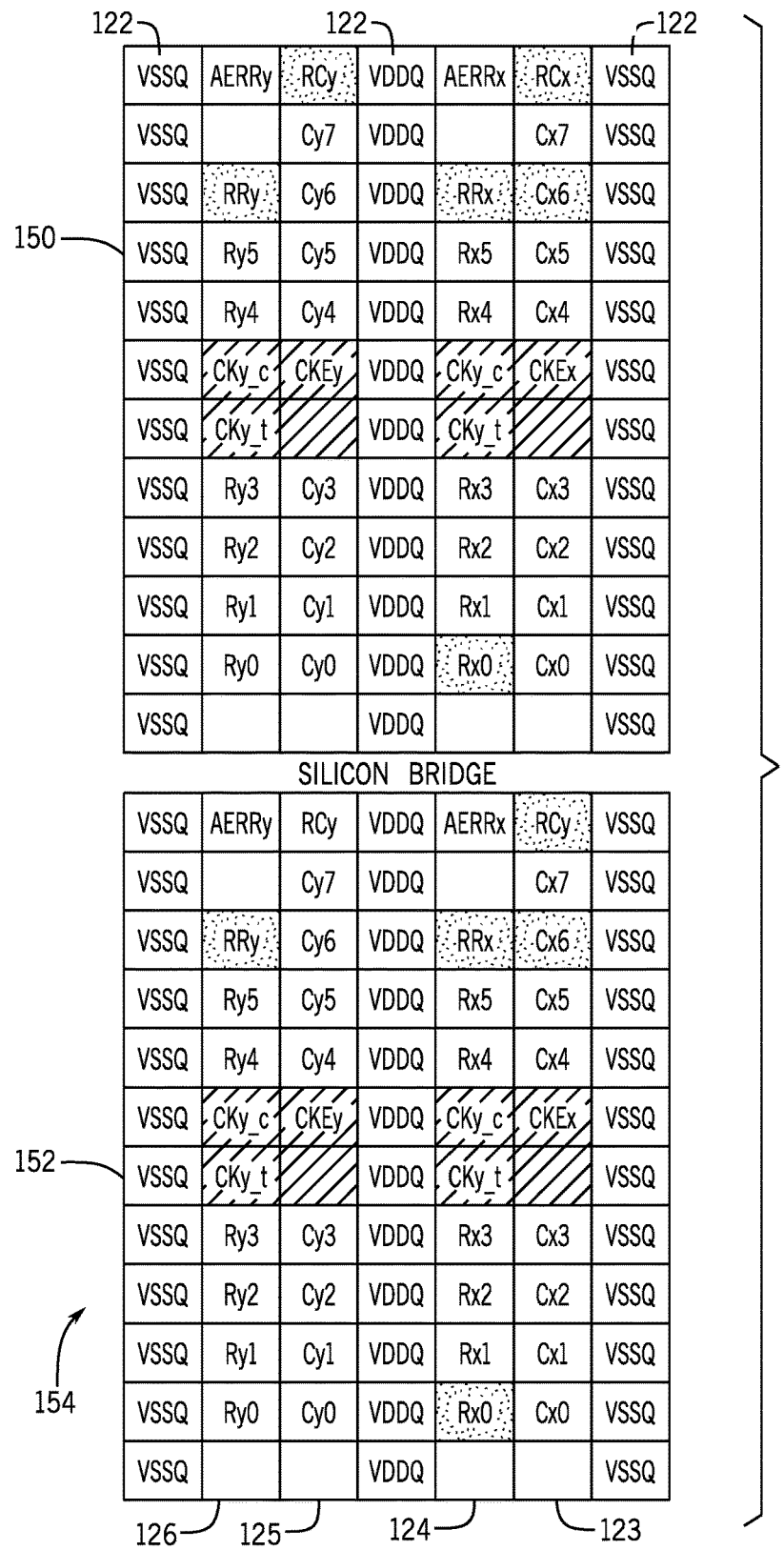
FIG. 6A illustrates an unremapped interconnection format between a first device and a second device, in accordance with an embodiment.
Figure 6B:
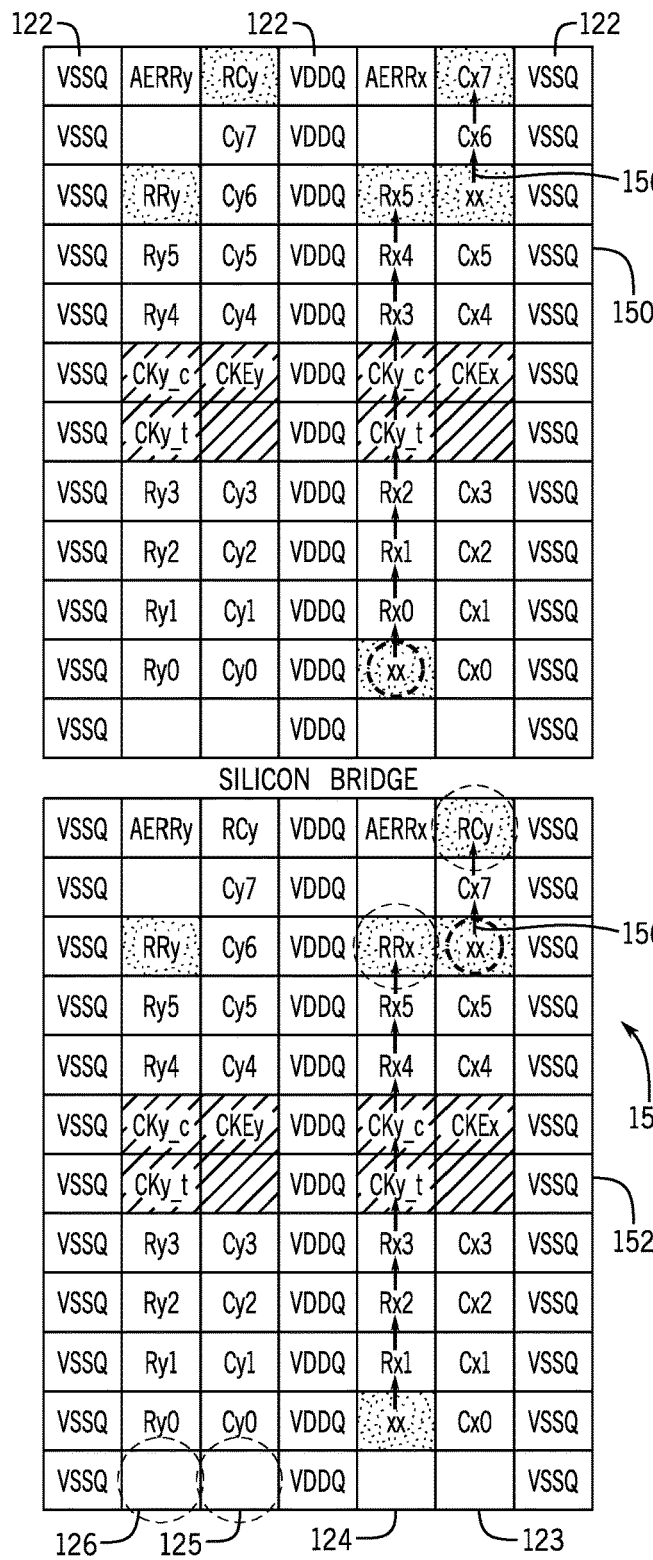
FIG. 6B illustrates a remapped interconnection format between the first device and the second device of FIG. 6A, in accordance with an embodiment.

FIGS. 6A and 6B illustrate an example interconnection remap between a first device 150 and a second device 152. FIG. 6A illustrates an unremapped interconnection format 154 between the first device 150 and the second device, and FIG. 6B illustrates a remapped interconnection format 155 between the first device 150 and the second device 152. The first device 150 may include an HBM2 device. The second device 152 may include an HBM2 device. The interconnects may be for AWORD pairs. The unremapped interconnection format 154 includes faulty interconnects on original Cx6 and Rx0. For lane 123, the BASE=7 (corresponding to Cx6) and LIMIT=9 (corresponding to RCx) in MODE 0 for Cx6 repair. RCx is a redundant IO. Since the shifting is in an upward mode, each interconnect function is shifted 156 upward between Cx6 and RCx. The number of shifts for may be determined by the difference between the LIMIT and BASE. Thus, Cx6 and Cx7 are each to be shifted upward.

For lane 124, the BASE=1 (corresponding to Rx0) and LIMIT=7 (corresponding to RRx) since the shift is in upward mode. As illustrated, RRx is a redundant IO. Since 7−1=6, six IO (Cx0-Rx5) functionalities are to be shifted upward. For lanes 125 and 126, the BASE and LIMIT may be set to a common value that indicate no shifting since no shifting is to occur.

Figure 7A:
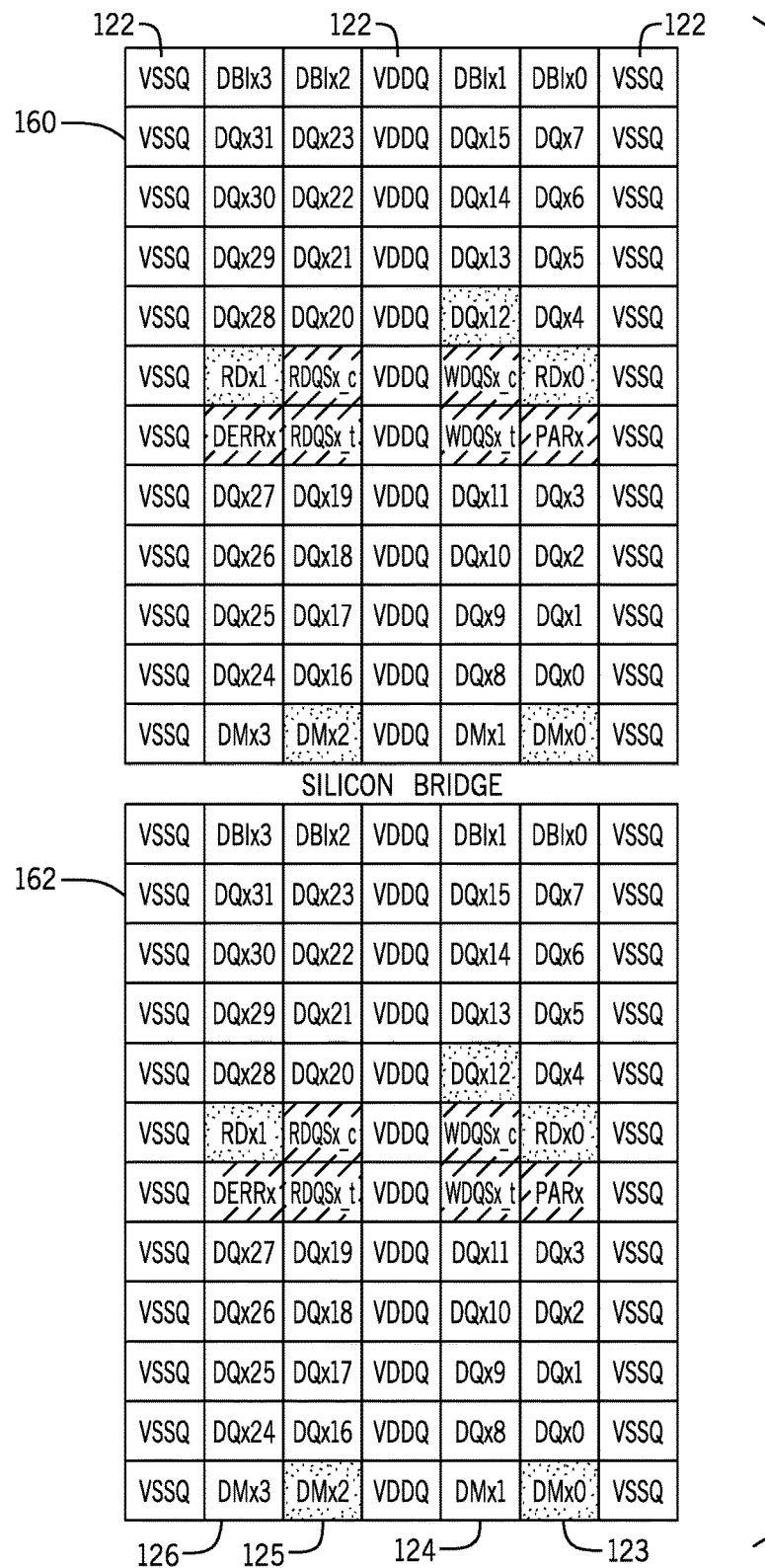
FIG. 7A illustrates an unremapped interconnection format between a first device and a second device, in accordance with an embodiment.

FIGS. 7A and 7B illustrate an example interconnection remapping between a first device 160 and a second device 162. In the illustrated embodiment, the interconnection between these devices may be for DWORDs. Erroneous interconnections are shown to be present on original DMx0, DQx12 and DMx2. To correct lane 123 including erroneous interconnect DMx0, BASE=0 and LIMIT=9 is set to an upward shift 164 in device 160 and an upward shift 166 in device 162 for DMx0 repair. These values result in forward incremental shifts on lane 123 of DMx0 to DQx7. To correct lane 124 BASE=6 and LIMIT=10 with upward shifts 164 and 166 for DQx12 repair. These values result in forward incremental shifts on lane 124 DQx12 to DBIx1. To correct lane 125, BASE=0 and LIMIT=9 for upward shifts 164 for DMx2 repair. With no redundant IOs and functional recovery enabled, RDx1 is remapped to DBIx2. Functional recovery shifting 168 from lane 125 to lane 126 may be set by setting pins from the lane exchange from lane 125 to lane 126 as FCID=11, FCSEL=0 and FCEN=1. Thus, this results in incremental forward shifts on lane 125 DMx2 to DBIx2. In the illustrated embodiment, no repairs are to occur for lane repairs on lane 126 other than shifting DBIx2→RDx1 for functional recovery.

Figure 8B:
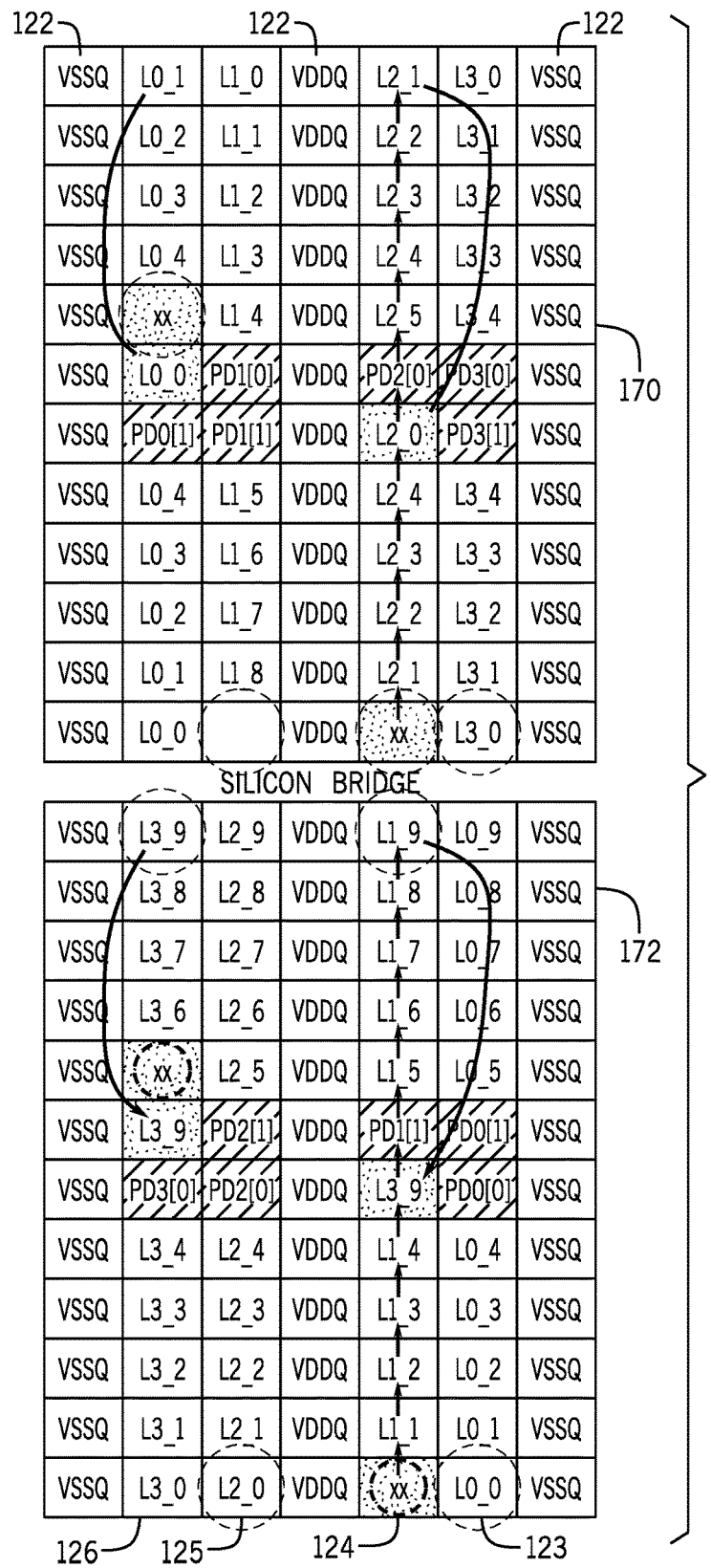
FIG. 8B illustrates a remapped interconnection format between the first device and the second device of FIG. 8A, in accordance with an embodiment.

FIGS. 8A and 8B illustrate an example interconnection remapping between a first device 170 and a second device 172. The first and second devices 170, 172 may include any UM devices. Furthermore, as previously noted, the orientation of these devices may be face-to-face such that a remap of one device is remapped with a reverse mode in the other device. The devices 170 and 172 (similar to the previously illustrated pairs in FIGS. 6A, 6B, 7A, and 7B) are illustrated that the shifts occur in a same direction in the respective figure, but the shifts are in opposite directions relative to the silicon bridge between the devices 170 and 172. Furthermore, note that the second device 172 has interconnects that are flipped and reversed from those in the first device 170.

For example, note that interconnect L0_0 occurs in the top left corner in the first device 170 and in the bottom right corner in the second device 172. These interconnects may be mapped together or may be mapped to different interconnects to maintain somewhat consistent route lengths between the devices 170 and 172, as previously discussed.

In the illustrated embodiment, an erroneous interconnection is shown on original L1_0 for device 170 that maps to L2_9 for device 172. Another erroneous interconnection is shown between L3_5 for device 170 and L0_4 for device 172.

To repair the interconnect L1_0 for device 170 to L2_9 for device 172, the device 170 is shifted using BASE=0 and LIMIT=9 with MODE 0. These values result in incremental forward shifts from L1_0 to L1_9 in the lane 124. The device 172 is shifted using BASE=0 and LIMIT=9 with MODE 1 (reverse direction). These values result in reverse incremental shifts in the lane 124 from L2_9 to L2_0 to maintain corresponding mapping between interconnects when shifting the mapping of the devices 170 and 172.

To enable functional recovery in the device 170, the device 170 may receive FCID=10, FCSEL=1 (functional recovery select), and FCEN=1 (functional recovery enable) for lane 124. These values result in shifting L1_9 to PD1[0] for functional recovery.

To enable functional recovery in the device 172, the device 172 may receive FCID=01, FCSEL=0 and FCEN=1 for lane 126. These values result in shifting L2_0 to PD2[1] for functional recovery.

To repair the interconnect for L3_5 for device 170 to L0_4 for device 172, the device 170 is shifted using BASE=5 and LIMIT=9 for a MODE 0 shift. These values result in step-wise forward shifts on lane 126 from L3_5 to L3_9. The device 172 is reverse shifted using BASE=0 and LIMIT=4 for MODE 1 shift. These values result in step-wise reverse shifts on lane 126 from L0_4 to L0_0.

Furthermore, the device 170 is programmed using settings FCID=11, FCSEL=1 and FCEN=1 for lane 126 to recover functionalities through the shifting. These values result in shifting L1_9 to PD3[1] for functional recovery. Similarly, the device 172 is programmed using settings FCID=00, FCSEL=0 and FCEN=1 for lane 124 resulting in shifting L2_0 to PD0[0] for functional recovery. Note that no repairs are conducted on lane 123 and lane 125 since no malfunctions appear in such lanes.

Figure 9A:
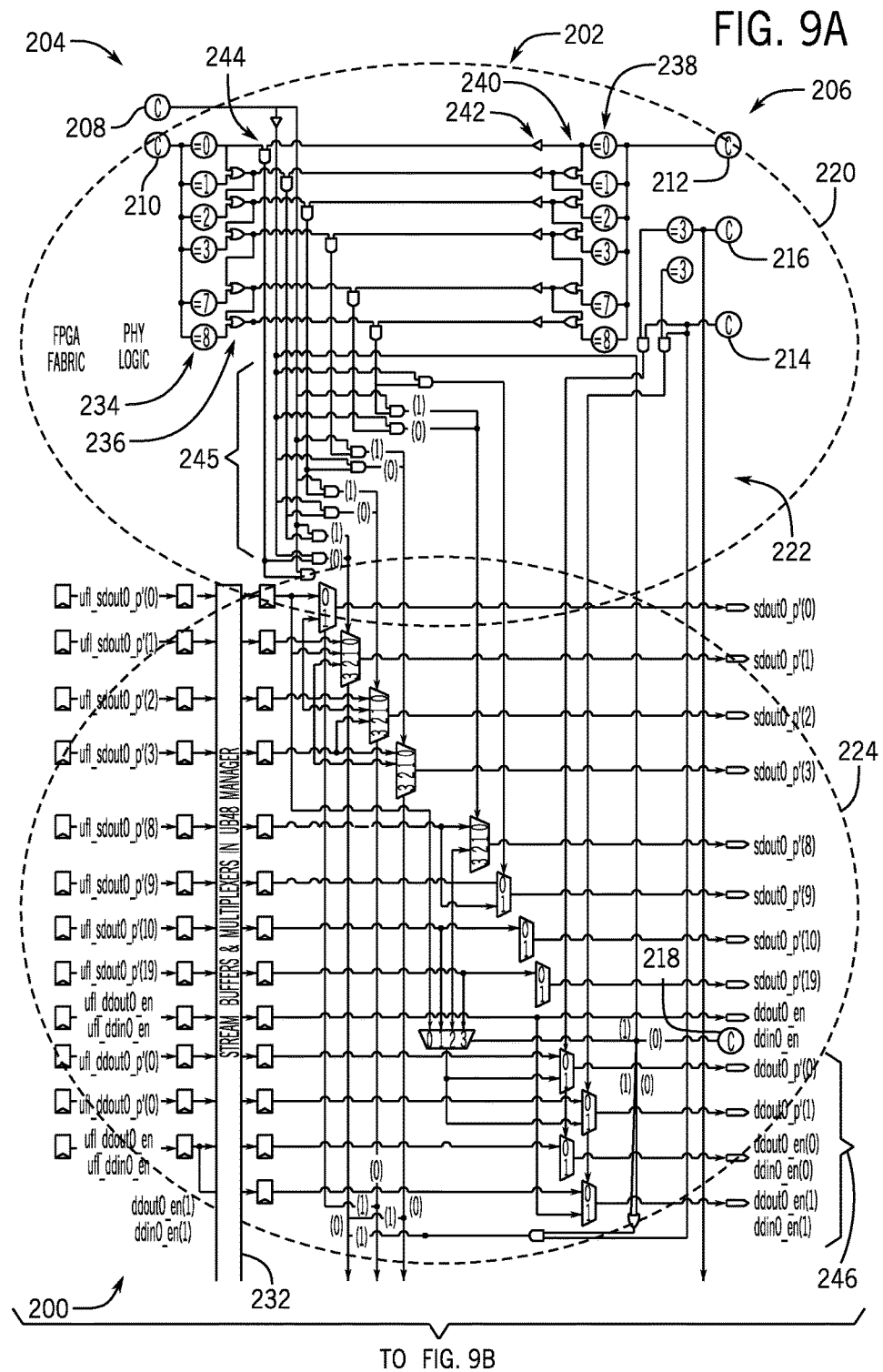
FIG. 9A illustrates a first portion of circuitry that may be used to implement the remap shifting of FIGS. 5A-8B, in accordance with an embodiment.
Figure 9B:
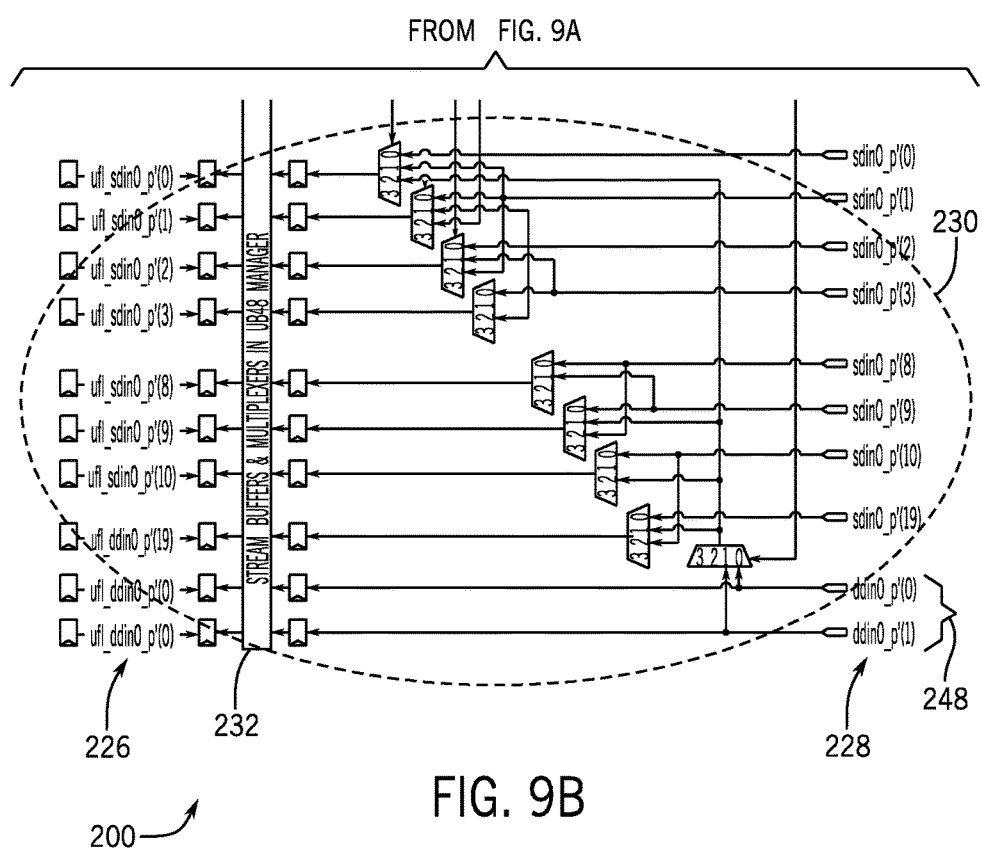
FIG. 9B illustrates a second portion of the circuitry of FIG. 9A that may be used to implement the remap shifting of FIGS. 5A-8B, in accordance with an embodiment.

FIGS. 9A and B illustrate circuitry 200 that may be used to implement the shifting/remapping of FIGS. 5A-8B in accordance with an embodiment. The circuitry 200 includes a remapping circuitry 202 coupling an internal portion 204 to an external portion 206. The internal portion 204 includes circuitry for the respective device that performs functions of the device. For example, the internal portion 204 may include a field programmable gate array (FPGA) fabric. The external portion 206 includes connections to other devices. For example, the external portion 206 may be a pinout for a die to another die through microbumps, interposers, a silicon layer, and/or other physical interconnection types. The remapping circuitry 202 receives inputs 208, 210, 212, 214, 216, and 218. For example, the input 208 may correspond to a MODE (e.g., direction) for the shift. The input 210 may correspond to the BASE. As previously noted, the BASE is the lowest unit relative to the direction or the first function involved in the shift. The input 212 may correspond to the LIMIT. As previously noted, the LIMIT is highest unit/target of last shift involved in the shift. The input 214 may correspond to a functional recovery enable pin that enables functional recovery in the shift. The input 216 may correspond to a functional recovery ID pin that selects to which PDIO a shifted function is to be recovered. The input 218 may correspond to a functional recovery select pin that selects to which PSIO within the selected PDIO is used to recover the shifted function.

These inputs 208, 210, 212, 214, and 216 are used to remap connections in the remapping circuitry 202 between the internal portion 204 and the external portion 206. For example, these connections may be shifted for to redundant locations using shift control circuitry 220. Specifically, the shift control circuitry 220 receives indications of the shift direction, start point, and end point to incrementally shift the functions of the interconnections to take advantage of available locations. The shift control circuitry 220 then sends control signals 222 to interconnect multiplexers 224 that are used for transmissions from internal connection ports 226 of the internal circuitry 204 to external connection ports 228 of the external circuitry 206. Additionally or alternatively, the control signals 222 are sent from the shift control circuitry 220 to interconnect multiplexers 230 that are used for receiving data from the external connection ports 228 of the external circuitry 206 to the internal connection ports 226 of the internal circuitry 204. In some embodiments, stream buffers 232 may be used to buffer signals from the internal connection ports 226 and/or the external connection ports 228 to the remapping circuitry 202.

In the shift control circuitry 220, the input 210 indicates a beginning/ending location for shifting. This may be the BASE and/or faulty interconnect when the mode is in a first direction or the target location when the mode is in a second direction. This input 210 is supplied to comparators 234. The comparators 234 determine whether the input 210 identifies a specific number. The number of comparators 234 may correspond to a number of items (e.g., PSIOs) in a single row and/or may correspond to a number of shifts available in the device. Once a base is selected, all values may potentially be shifted since the shifts incrementally occur. This property is reflected using OR gates 236 that potentially flag all higher numbered units as potentially to be shifted if a lower-numbered unit is flagged to be shifted. However, the input 210 is not enough alone to shift functionality. Instead, only those units occurring between the BASE (e.g., input 210) and the LIMIT (e.g., input 212) are shifted. Thus, input 212 is submitted to another set of comparators 238 that are used to flag whether input 212 corresponds to the number indicated in the input 212. The number of comparators 238 may correspond to a number of units (e.g., PSIOs) in a row and/or a maximum distance of shifting possible in the row or lane. Using OR gates 240, the input 212 and all higher numbered units are selected. However, since the input 212 indicates an end of the shift, only the units with lower numbers are to be selected. Accordingly, inverters 242 invert the signals to flag only units occurring before the end as to be shifted. The units are thus flagged as whether they are higher than the received BASE and whether they are lower than the LIMIT. If both are true, AND gates 244 pass values (e.g., 1 or 0) indicating whether the corresponding unit is to be shifted. Furthermore, the input 208 receives an indication of a mode or direction for the shifts. Thus, the output of the AND gates 244 are passed to direction-selecting AND gates 245, that activate shifts in multiplexers 224 and/or 230 by selecting an adjacent interconnect to be remapped. For example, if the unit is to be shifted, the input 208 indicates whether to shift to a next unit in a forward direction or a next unit a reverse direction. For example, a multiplexer 224 may be used to select ufi_sdout0_p*[1] as no shift, ufi_sdout1_p*[2] as a forward shift, or ufi_sdout0_p*[0} as a reverse shift.

As previously discussed, the input 214 indicates whether functions are to be recovered to PDIOs. This input 214 is passed to function recovery circuitries 246 and 248. The function recovery circuitry 246 recovers functions that are to be transmitted, and function recovery circuitry 248 recovers functions that are to be received. The input 216 determines in the function recovery circuitries 246 and 248 which lane is to be used to recover shifted functions. Moreover, the input 218 further indicates which unit (e.g., PDIO) is to be used in the lane.

While the embodiments set forth in the present disclosure may be susceptible to various modifications and alternative forms, specific embodiments have been shown by way of example in the drawings and have been described in detail herein. However, it should be understood that the disclosure is not intended to be limited to the particular forms disclosed. The disclosure is to cover all modifications, equivalents, and alternatives falling within the spirit and scope of the disclosure as defined by the following appended claims.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. An integrated circuit device, comprising:
a plurality of internal connection ports to transmit data to or receive data from a first portion of the integrated circuit device;
a plurality of external connection ports to transmit data to or receive data from outside the integrated circuit device; and
remapping circuitry that remaps from a first connection between a first internal connection port of the plurality of internal connection ports and a first external connection port of the plurality of external connection ports to a second connection between a second internal connection port of the plurality of internal connection ports and a second external connection port of the plurality of external connection ports.

2. The integrated circuit device of claim 1 comprising a plurality of inputs that receive controls for the remapping using the remapping circuitry.

3. The integrated circuit device of claim 2, wherein the plurality of inputs comprises a direction input that indicates whether the remapping occurs in a first direction or a second direction.

4. The integrated circuit device of claim 2, wherein the plurality of inputs indicates whether the integrated circuit device has a functional recovery mode enabled, wherein the functional recovery mode remaps a function from a first unit type to a second unit type when an end of a lane of the first unit type is reached.

5. The integrated circuit device of claim 4, wherein the first unit type comprises a single-ended input output unit, and the second unit type comprises a differential input output unit.

6. The integrated circuit device of claim 5, wherein the plurality of inputs comprises a differential output unit selector to select a specific differential output unit.

7. The integrated circuit device of claim 6, wherein the differential output unit selector selects the specific differential output unit in a lane of differential output units that is in line with the lane of the first unit type.

8. The integrated circuit device of claim 6, wherein the differential output unit selector selects the specific differential output unit in a lane of differential output units that is not in line with the lane of the first unit type.

9. The integrated circuit device of claim 5, wherein the plurality of inputs comprises a single-ended input output unit selector that selects a single-ended output unit in a target differential input output unit.

10. The integrated circuit device of claim 2, wherein the plurality of inputs is received from an external controller external to the integrated circuit device.

11. The integrated circuit device of claim 2, comprising a controller from which the plurality of inputs are received.

12. The integrated circuit device of claim 2, wherein the plurality of inputs is received from an external device that is coupled to plurality of external connections of the integrated circuit device.

13. An integrated circuit system comprising:
   a plurality of control inputs;
   a plurality of internal connection ports to transmit data to or receive data from an internal portion of the integrated circuit system;
   a plurality of external connection ports to transmit data to or receive data from outside the integrated circuit system; and
   remapping circuitry that remaps from a first connection between a first internal connection port of the plurality of internal connection ports and a first external connection port of the plurality of external connection ports to a second connection between a second internal connection port of the plurality of internal connection ports and a second external connection port of the plurality of external connection ports, wherein the first and second internal connection ports are in a common internal port lane, the first and second external connection ports are in a common external port lane, and the remapping is based at least in part on the control inputs.

14. The integrated circuit system of claim 13, wherein the plurality of control inputs comprises an indication of faulty connection to be remapped.

15. The integrated circuit system of claim 13, wherein the plurality of control inputs comprises an indication of an end of a remapping shift.

16. The integrated circuit system of claim 15, wherein the end of remapping shift comprises an end of a lane of internal connection ports.

17. The integrated circuit system of claim 15, wherein the end of remapping shift comprises a redundant internal connection port in a lane of internal connection ports.

18. A system comprising:
   a first die comprising:
      first internal circuitry that generates or processes first data;
      first external circuitry that receives the first data from or transmits the first data to the first internal circuitry; and
      first remapping circuitry that remaps ports between the first internal circuitry and the first external circuitry;
   an interconnector; and
   a second die comprising:
      second internal circuitry that generates or processes second data;
      second external circuitry that receives the second data from or transmits the second data to the second internal circuitry, wherein the second external circuitry couples to the first external circuitry via the interconnector; and
      second remapping circuitry that remaps ports between the second internal circuitry and the second internal circuitry, wherein the first and second remapping circuitry remap connections to repair connections between the first and second die through the interconnector.

19. The system of claim 18, wherein the first and second die are arranged in a face-to-face arrangement, the first remapping circuitry remaps the ports between the first internal circuitry and the first external circuitry in a first direction, and the second remapping circuitry remaps ports between the second internal circuitry and the second internal circuitry in a second direction, and the first and second directions are opposite relative to an orientation of the respective first and second die.

20. The system of claim 18, wherein the first die is a high bandwidth memory stack utilizing an interconnect redundancy remap, and the second die is a uniform interface bus device.

* * * * *